US00RE48135E

(19) United States
(12) Reissued Patent
Jau et al.

(10) Patent Number: US RE48,135 E
(45) Date of Reissued Patent: Jul. 28, 2020

(54) SERVER SYSTEM

(71) Applicant: Quanta Computer Inc., Taoyuan (TW)

(72) Inventors: Maw-Zan Jau, Taipei (TW); Wei-Yi Chu, Taipei (TW); Chao-Jung Chen, New Taipei (TW); Tzu-Hung Wang, Keelung (TW); Chih-Ming Chen, New Taipei (TW)

(73) Assignee: QUANTA COMPUTER INC., Taoyuan (TW)

(21) Appl. No.: 14/822,002

(22) Filed: Aug. 10, 2015

Related U.S. Patent Documents

Reissue of:
(64) Patent No.: 8,817,464
Issued: Aug. 26, 2014
Appl. No.: 13/346,750
Filed: Jan. 10, 2012

(30) Foreign Application Priority Data

Aug. 11, 2011 (TW) ..... 100214923 U

(51) Int. Cl.
*H05K 7/14* (2006.01)
*H05K 7/20* (2006.01)

(52) U.S. Cl.
CPC ..... *H05K 7/1492* (2013.01); *H05K 7/20136* (2013.01); *H05K 7/20718* (2013.01)

(58) Field of Classification Search
None
See application file for complete search history.

(56) References Cited

U.S. PATENT DOCUMENTS 4,805,856 A * 2/1989 Nicoli ..... F16L 3/233 24/16 PB
6,310,783 B1 * 10/2001 Winch et al. ..... 361/797
6,442,017 B1 * 8/2002 Ewing ..... G06F 1/189 174/38
6,442,030 B1 * 8/2002 Mammoser ..... G06F 1/1601 248/917
6,469,899 B2 * 10/2002 Hastings ..... H05K 7/1489 248/65
6,482,046 B1 * 11/2002 Salinas ..... H01R 13/506 439/677
6,523,918 B1 * 2/2003 Baiza ..... H05K 7/1489 211/26
6,639,792 B1 * 10/2003 Chang ..... G06F 1/184 174/541
6,669,151 B2 * 12/2003 Mascadri ..... F16L 3/233 248/65
6,702,237 B2 * 3/2004 Rubenstein ..... F16L 3/003 248/49
6,801,428 B2 * 10/2004 Smith ..... G06F 1/181 165/80.3

(Continued)

*Primary Examiner* — Glenn K Dawson
(74) *Attorney, Agent, or Firm* — Nixon Peabody LLP

(57) ABSTRACT

A server system includes a rack, a power supply module, a switch, and a plurality of servers. The rack can be divided into a plurality of rack units. The rack units are parallel to each other and vertically arranged. The power supply module and the switch are disposed in close proximity to each other in at least one of the rack units. The power supply is adjacent to the rear side of the rack. The switch is adjacent to the front side of the rack. Each of the servers is disposed in one of the other rack units and electrically connected to the power supply module and the switch.

13 Claims, 5 Drawing Sheets

(Amended)

(56) References Cited

U.S. PATENT DOCUMENTS 6,826,036 B2 * 11/2004 Pereira ..... G06F 1/189 361/624
6,856,505 B1 * 2/2005 Venegas ..... G06F 1/1601 361/679.05
6,867,701 B2 * 3/2005 Lawrence ..... H05K 7/20836 340/3.43
7,012,815 B2 * 3/2006 Garnett ..... G06F 1/183 361/679.31
7,219,183 B2 * 5/2007 Pettey ..... H04L 49/25 709/236
7,240,225 B2 * 7/2007 Brewer ..... G06F 1/3203 713/300
7,289,334 B2 * 10/2007 Behrens ..... G06F 1/18 361/752
7,512,704 B2 * 3/2009 Nelson ..... G06F 3/023 709/238
7,791,890 B2 * 9/2010 Ishida ..... H05K 7/1492 211/26
7,855,872 B2 * 12/2010 Rasmussen ..... G06F 1/189 174/480
8,274,792 B2 * 9/2012 Soffer ..... G06F 1/18 361/700
8,400,113 B2 * 3/2013 Waring ..... H02J 3/14 320/137
8,400,765 B2 * 3/2013 Ross ..... H05K 7/20727 165/104.33
8,674,823 B1 * 3/2014 Contario ..... H02J 1/10 340/333
9,101,080 B2 * 8/2015 Czamara ..... H05K 7/1497
9,338,922 B2 * 5/2016 Mick ..... H05K 7/1491
9,468,126 B2 * 10/2016 Pronozuk ..... H05K 7/1488
9,578,784 B2 * 2/2017 Stellick ..... H05K 7/20727
9,846,467 B2 * 12/2017 Gardner ..... G06F 1/30
2002/0080575 A1 * 6/2002 Nam ..... G06F 1/184 361/679.47
2005/0068716 A1 * 3/2005 Pereira ..... 361/624
2007/0245165 A1 * 10/2007 Fung ..... 713/320
2009/0016019 A1 * 1/2009 Bandholz et al. ..... 361/695
2009/0237876 A1 * 9/2009 Suzuki et al. ..... 361/679.33
2009/0262501 A1 * 10/2009 Claassen et al. ..... 361/701
2010/0172078 A1 * 7/2010 Tanaka et al. ..... 361/679.5
2011/0063778 A1 * 3/2011 Brouillard ..... 361/678
2011/0078346 A1 * 3/2011 O'Connor ..... H04L 49/351 710/63
2011/0222241 A1 * 9/2011 Shearman et al. ..... 361/692
2011/0296162 A1 * 12/2011 Pakenham ..... G06F 1/3203 713/100
2012/0069514 A1 * 3/2012 Ross ..... 361/679.33
2014/0277819 A1 * 9/2014 Mick ..... G05D 23/1917 700/300
2016/0378162 A1 * 12/2016 Calio ..... G06F 1/3209 700/293

* cited by examiner

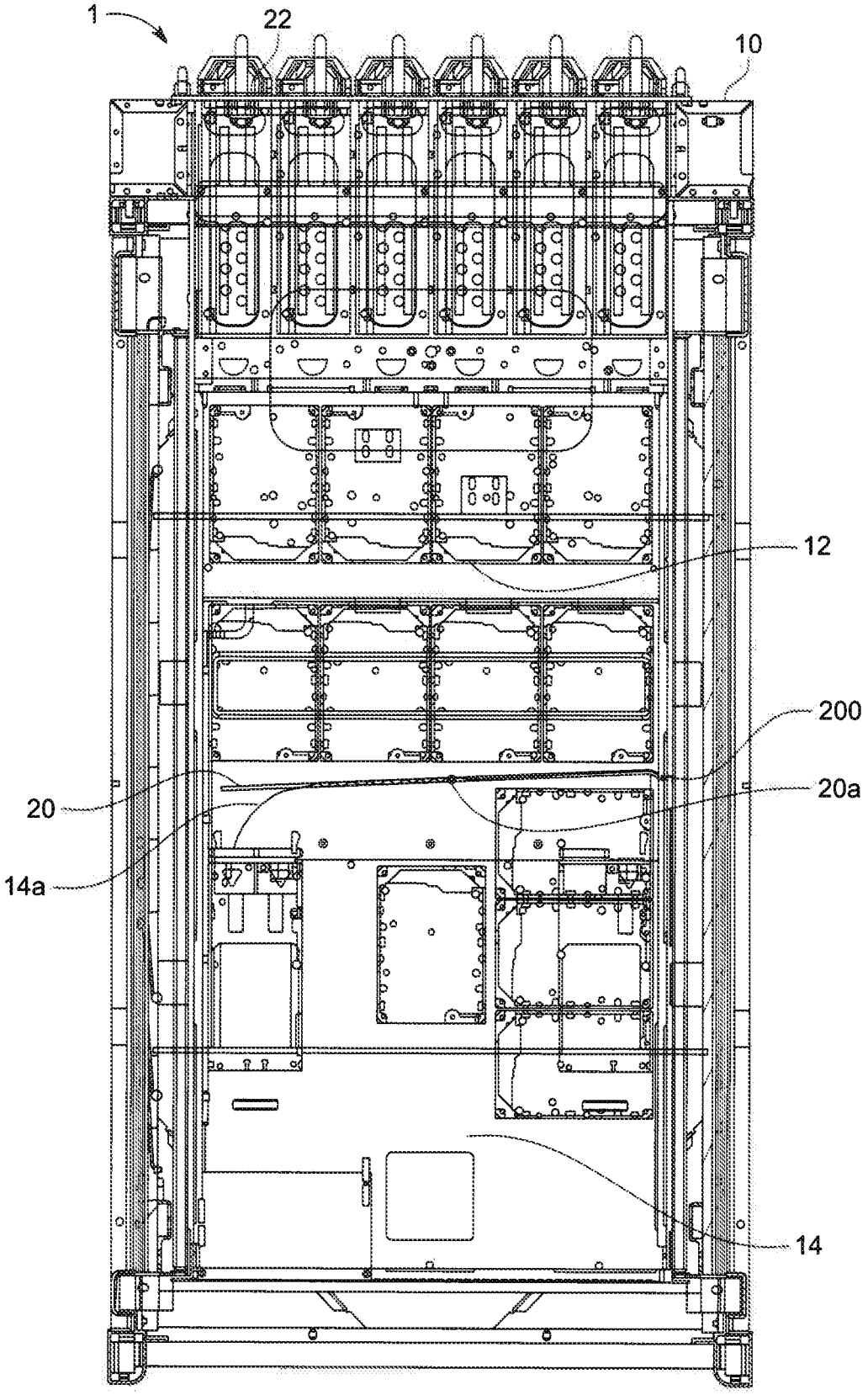
FIG. 3 (Amended)

SERVER SYSTEM

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

RELATED APPLICATIONS

This application claims priority to Taiwan Application Serial Number 100214923, filed Aug. 11, 2011, which is herein incorporated by reference.

BACKGROUND

1. Field of Invention

The present invention relates to a server system, and more particularly, to a server system that is able to increase the denseness of servers therein.

2. Description of Related Art

Motherboards in a rackmount server are slidably disposed in a rack. Based on this concept, a whole server system can be regarded as a large rack, and a plurality of drawers for horizontally carrying servers can be installed in the rack. Motherboards are disposed on the drawers to be connected to the servers. In order to transmit signals, a plurality of connectors are disposed on each motherboard to enable series connections with other motherboards, so as to improve the multitasking ability of the server system and achieve high computing performance.

A rack unit is a unit of server defined by the EIA (Electronic Industries Alliance). One rack unit is commonly referred to as "1U," two rack units as "2U," and so on. The height of one rack unit is 1.75 inches, and the width of one rack unit is 19 inches. The height of two rack units is 3.5 inches, but the width of two rack units is still 19 inches. Accordingly, no matter how the internal components in a server system of N rack units are arranged, they must fall within the limitation of the height of the server system.

Generally, a server includes a host, a power supply module, and transmission lines. The power supply module is used to provide necessary electricity to the host, and the transmission lines are used to electrically connect components of the host. Each of the motherboards further has a hard disk carrying rack for carrying a plurality of hard disks.

SUMMARY

The invention provides an improved server system. The server system of the invention integrates power supplies, each of which is disposed at the back of one server, into a power supply module, and installs the power supply module and a switch respectively at a front side and a rear side of the same rack unit in a rack, so as to reduce the amount of space used in the rack and thus allow for the installation of more servers. Moreover, in order to reduce the quantity and total length of cables used in the server system, the invention further places the power supply module and the switch at a center location of the rack and additionally designs a line bracket for attachment of a transmission line of the switch. Therefore, the invention can overcome both space limitations and difficulties associated with cable management, so as to obtain higher denseness of servers using the same rack structure.

According to an embodiment of the invention, a server system includes a rack, a power supply module, a switch, and a plurality of servers. The rack can be divided into a plurality of rack units that are parallel to each other and vertically arranged. The power supply module and the switch are disposed in close proximity to each other in at least one rack unit. The power supply module is adjacent to the rear side of the rack. The switch is adjacent to the front side of the rack. Each of the servers is disposed in one of the other rack units and electrically connected to the power supply module and the switch.

In an embodiment of the invention, the at least one rack unit in which the power supply module and the switch are disposed is near the center of the rack.

In an embodiment of the invention, the server system further includes a power distribution unit. The power distribution unit is disposed in the rack. The power distribution unit is detachably connected to the power supply module and the switch for providing external electricity to the power supply module and the switch.

In an embodiment of the invention, the switch is detachably connected to the power distribution unit by a power line. The server system further includes a line bracket. The line bracket is disposed in the rack and located at the back of the switch. The power line is attached to the line bracket.

In an embodiment of the invention, an end of the line bracket is pivotally connected to the inner wall of the rack. The line bracket is pulled to rotate by the power line when the switch is taken out from the front side of the rack.

In an embodiment of the invention, the server system further includes a cable tie for attaching the power line to the line bracket.

In an embodiment of the invention, the server system further includes an uninterruptible power supply. The uninterruptible power supply is electrically connected to the power distribution unit and the power supply module.

In an embodiment of the invention, the server system further includes a plurality of fan modules. The fan modules are disposed at the rear side of the rack for dissipating heat generated by the power supply module, the switch, and the server units.

In an embodiment of the invention, the power supply module is electrically connected to the server units utilizing data bus connections.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 3 is a sectional view near the center of the server system in FIG. 1A.

DETAILED DESCRIPTION

Figure 1A:
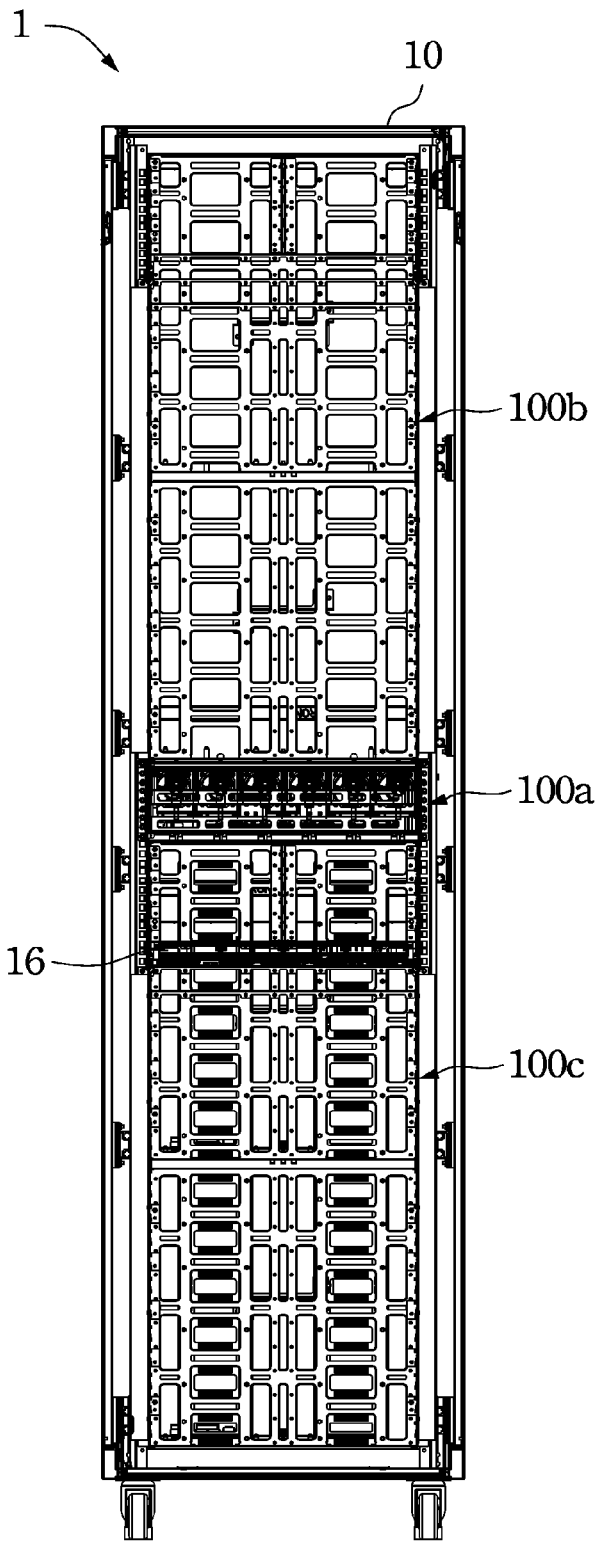
FIG. 1A is a front view of a server system according to an embodiment of the invention.

Reference will now be made in detail to the present embodiments of the invention, examples of which are illustrated in the accompanying drawings. Wherever possible, the same reference numbers are used in the drawings and the description to refer to the same or like parts.

An improved server system is provided. Specifically, a server system of the invention integrates power supplies, each of which is disposed at the back of one server, into a power supply module, and installs the power supply module and a switch respectively at a front side and a rear side of the same rack unit in a rack, so as to reduce the amount of space used in the rack and thus allow for the installation of more servers. Moreover, in order to reduce the quantity and total length of cables used in the server system, the invention further places the power supply module and the switch at a center location of the rack and additionally designs a line bracket for attachment of a transmission line of the switch. Therefore, the invention can overcome problems associated with both space limitations and cable management, so as to obtain higher denseness of servers using the same rack structure.

Figure 1B:
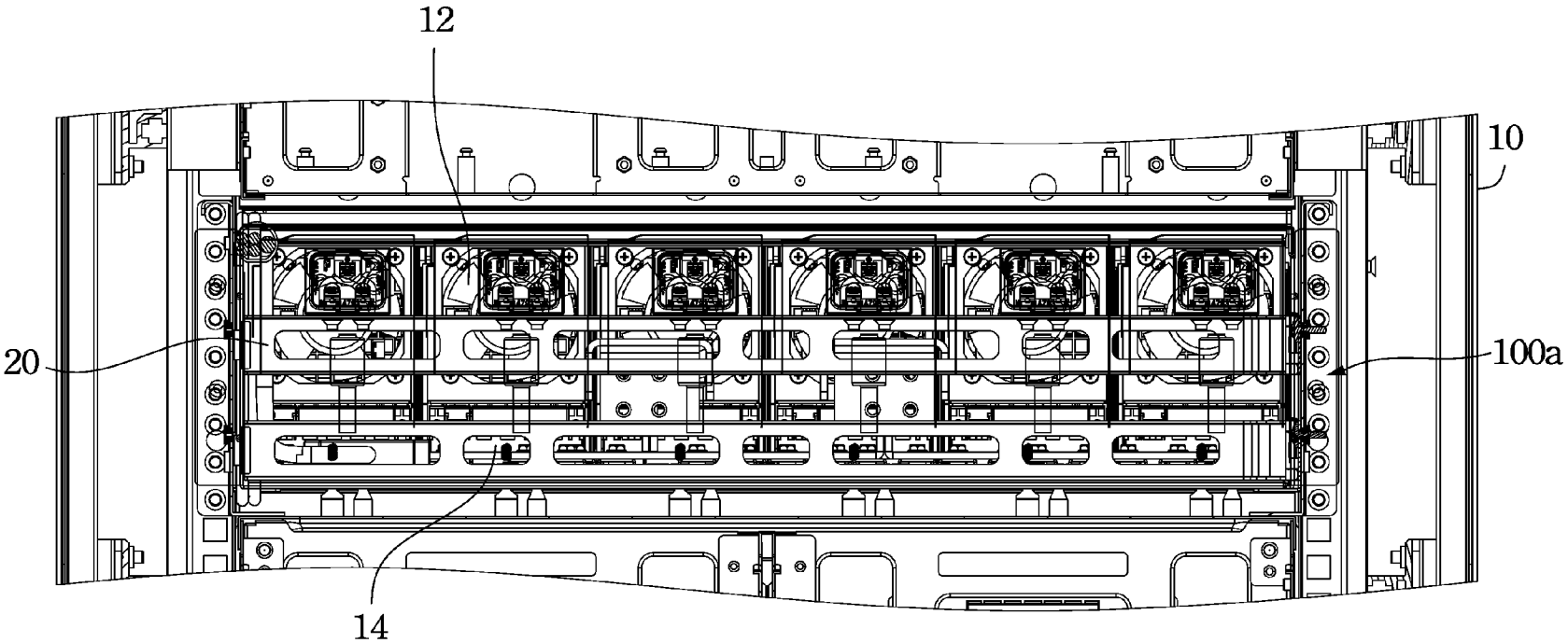
FIG. 1B is a partial front view of the server system in FIG. 1A.

FIG. 1A is a front view of a server system 1 according to an embodiment of the invention. FIG. 1B is a partial front view of the server system 1 in FIG. 1A.

As shown in FIG. 1A and FIG. 1B, the server system 1 according to the embodiment of the invention includes a rack 10, a power supply module 12, a switch 14, and a plurality of servers 16. The components disposed in the server system 1 of the embodiment will be described in detail below.

As shown in FIG. 1A and FIG. 1B, the rack 10 of the server system 1 can be divided into a plurality of rack units. The rack units in the rack 10 are parallel to each other and vertically arranged. The rack units in the rack 10 can be divided into central rack units 100a, upper rack units 100b, and lower rack units 100c. The power supply module 12 and the switch 14 can be disposed in close proximity to each other in at least one central rack unit 100a, at least one upper rack unit 100b, or at least one lower unit 100c in the rack 10. The power supply module 12 of the server system 1 is disposed adjacent to the rear side of the rack 10. The switch 14 of the server system 1 is disposed adjacent to the front side of the rack 10. Each of the servers 16 in the server system 1 is disposed in one of the other rack units, and is electrically connected to the power supply module 12 and the switch 14. Therefore, each of the servers 16 of the server system 1 can exchange data with the switch 14 and can be uniformly powered by the power supply module 12.

In the embodiment of the invention, the power supply module 12 and the switch 14 of the server system 1 are disposed in close proximity to each other in three rack units that are near the center of the rack 10, but the invention is not limited in this regard.

In the embodiment of the invention, in order to reduce the quantity and total length of cables used in the server system 1, the power supply module 12 and the switch 14 of the server system 1 are disposed in close proximity to each other in at least one central rack unit 100a that is near the center of the rack 10.

Figure 2A:
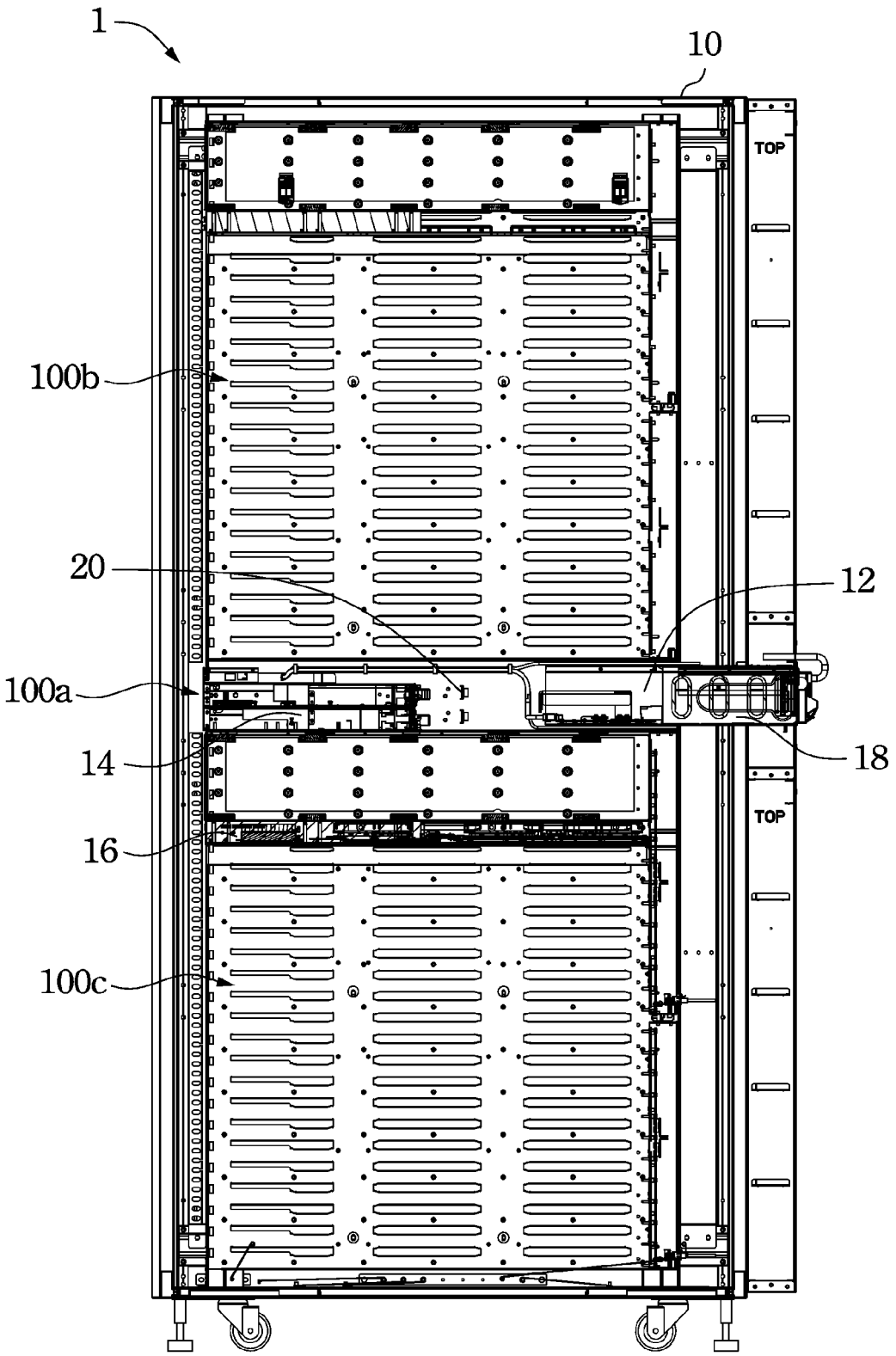
FIG. 2A is a side view of the server system in FIG. 1A.
Figure 2B:
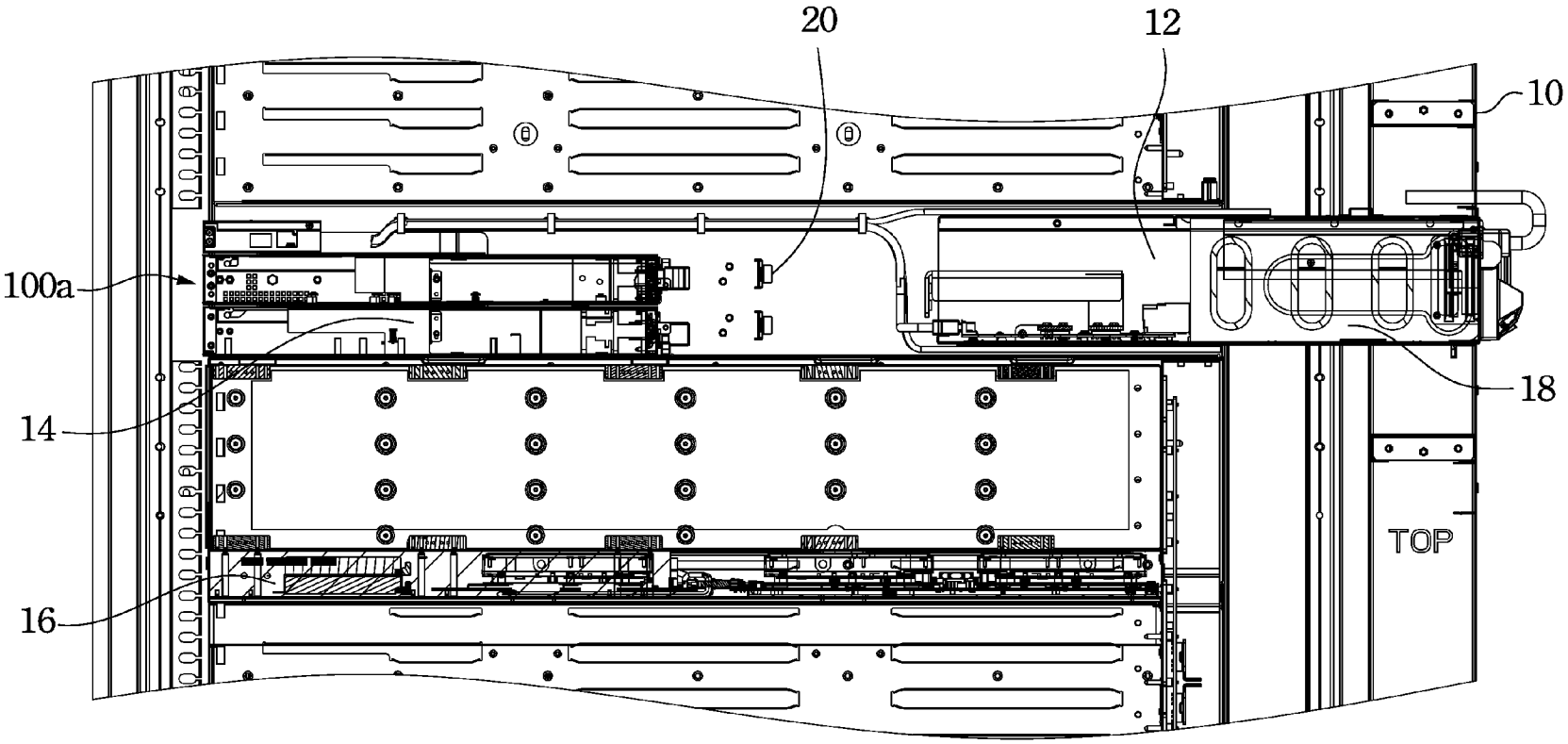
FIG. 2B is a partial side view of the server system in FIG. 2A.

FIG. 2A is a side view of the server system 1 in FIG. 1A. FIG. 2B is a partial side view of the server system 1 in FIG. 2A.

As shown in FIG. 2A and FIG. 2B, the server system 1 further includes a power distribution unit 18. The power distribution unit 18 of the server system 1 is disposed in the rack 10 and is detachably connected to the power supply module 12 and the switch 14. Through such a connection, the power distribution unit 18 of the server system 1 provides external electricity to the power supply module 12 and the switch 14.

FIG. 3 is a sectional view near the center of the server system 1 in FIG. 1A.

As shown in FIG. 1A to FIG. 3, the switch 14 of the server system 1 is detachably connected to the power distribution unit 18 by a power line 14a. The server system 1 further includes a line bracket 20. The line bracket 20 of the server system 1 is disposed in the rack 10 and located at the back of the switch 14. The power line 14a is attached to the line bracket 20 of the server system 1. Furthermore, an end of the line bracket 20 of the server system 1 is pivotally connected to the inner wall of the rack 10 *via an axis 200*. Through such a configuration, the line bracket is pulled by the power line 14a to rotate when the switch 14 is taken out from the front side of the rack 10. In other words, because the line bracket 20 of the server system 1 can rotate relative to the inner wall of the rack 10, the power line 14a of the switch 14 will not be damaged or severed by the pulling force between the switch 14 and the line bracket 20 when the switch 14 is taken out from the front side of the rack 10.

In the embodiment of the invention, the server system 1 further includes at least one cable tie 20a. The cable tie 20a of the server system 1 can be used to attach the power line 14a of the switch 14 to the line bracket 20, so that the power line 14a of the switch 14 is disposed in the rack 10 in a more organized manner. Hence, the power line 14a of the switch 14 will not hook onto components in the server system 1 and cause damage when the switch 14 is taken out from the front side of the rack 10.

In an embodiment of the invention, the server system 1 can include an uninterruptible power supply. The uninterruptible power supply of the server system 1 can be electrically connected to the power distribution unit 18 and the power supply module 12. The uninterruptible power supply of the server system 1 can be disposed near the power supply module 12 to continuously power the power supply module 12, but the invention is not limited in this regard.

As shown in FIG. 3, the server system 1 further includes a plurality of fan modules 22. The fan modules 22 of the server system 1 are disposed at the rear side of the rack 10 for dissipating heat generated by the power supply module 12, the switch 14, and the server units 16.

In one embodiment of the invention, the power supply module 12 of the server system 1 is electrically connected to the server units 16 utilizing data bus connections. The power supply module 12 of the server system 1 transmits alternating current to the servers 16 over and under the power supply module 12 by bus bars, so as to maintain automatic power balance. However, the type of electrical connections used between the power supply module 12 and the servers 16 is not limited in this regard.

According to the foregoing recitations of the embodiments of the invention, it can be seen that the server system of the invention integrates power supplies, each of which is disposed at the back of one server, into a power supply module, and installs the power supply module and a switch respectively at a front side and a rear side of the same rack unit in a rack, so as to reduce the amount of space used in the rack and thus allow for the installation of more servers. Moreover, in order to reduce the quantity and total length of cables used in the server system, the invention further places the power supply module and the switch at a center location of the rack and additionally designs a line bracket for attachment of a transmission line of the switch. Therefore, the invention can overcome both space limitations and difficulties associated with cable management, so as to obtain higher denseness of servers using the same rack structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A server system comprising:

a rack divided into a plurality of rack units that are parallel to each other and vertically arranged;

a power supply module and a switch disposed in close proximity to each other in at least one of the rack units, wherein the power supply module is adjacent to a rear side of the rack, and the switch is adjacent to a front side of the rack;

[a plurality of servers, each of the servers being disposed in one of the other rack units and electrically connected to the power supply module and the switch;]

a power distribution unit disposed in the rack, wherein the switch is detachably connected to the power distribution [writ] *unit* by a power line; and a line bracket disposed in the rack and located at a back of the switch, wherein the power line is attached to the line bracket*;*

*wherein an end of the line bracket is pivotally connected to an inner wall of the rack, and the line bracket is pulled to rotate by the power line when the switch is taken out from the front side of the rack.*

2. The server system of claim 1, wherein the at least one rack unit in which the power supply module and the switch are disposed is near the center of the rack.

3. The server system of claim 1, wherein the power distribution unit is detachably connected to the power supply module and the switch for providing external electricity to the power supply module and the switch.

[4. The server system of claim 1, wherein an end of the line bracket is pivotally connected to the inner wall of the rack, and the line bracket is pulled to rotate by the power line when the switch is taken out from the front side of the rack.]

5. The server system of claim 1, further comprising a cable tie for attaching the power line to the line bracket.

6. The server system of claim 1, further comprising a plurality of fan modules disposed at the rear side of the rack for dissipating heat generated by the power supply module[.] *and* the switch[, and the server units].

7. The server system of claim 1, wherein the power supply module is electrically connected to the [server] *rack* units utilizing data bus connections.

*8. A server system comprising:*

*a rack divided into a plurality of rack units that are parallel to each other and vertically arranged;*

*a power supply module and a switch disposed in close proximity to each other in at least one of the rack units, wherein the power supply module is adjacent to a rear side of the rack, and the switch is adjacent to a front side of the rack;*

*a plurality of servers, each of the servers being disposed in one of the other rack units and electrically connected to the power supply module and the switch;*

*a power distribution unit disposed in the rack, wherein the switch is detachably connected to the power distribution unit by a power line; and*

*a line bracket located in the rack and at a back of the switch, wherein the power line is attached to the line bracket;*

*wherein an end of the line bracket is pivotally connected to an inner wall of the rack and the line bracket is pulled to rotate by the power line when the switch is taken out from the front side of the rack.*

*9. The server system of claim 8, wherein the at least one rack unit in which the power supply module and the switch are disposed is near the center of the rack.*

*10. The server system of claim 8, wherein the power distribution unit is detachably connected to the power supply module and the switch for providing external electricity to the power supply module and the switch.*

*11. The server system of claim 10, further comprising an uninterruptible power supply to provide continuous power to at least one of the power supply module and the power distribution unit.*

*12. The server system of claim 8, further comprising a cable tie for attaching the power line to the line bracket.*

*13. The server system of claim 8, further comprising a plurality of fan modules disposed at the rear side of the rack for dissipating heat generated by the power supply module, the switch, and the servers.*

*14. The server system of claim 8, wherein the power supply module is electrically connected to the rack units utilizing data bus connections.*

* * * * *